(12) United States Patent
Ho

(10) Patent No.: US 7,211,450 B2
(45) Date of Patent: May 1, 2007

(54) SYSTEM AND METHOD FOR DETECTION OF SPATIAL SIGNATURE YIELD LOSS

(75) Inventor: Eng Keong Ho, Singapore (SG)

(73) Assignee: Systems on Silicon Manufacturing Co., Pte. Ltd., Singapore (SG)

( * ) Notice: Subject to any disclaimer, the term of this patent is extended or adjusted under 35 U.S.C. 154(b) by 170 days.

(21) Appl. No.: 11/036,672

(22) Filed: Jan. 14, 2005

(65) Prior Publication Data

US 2006/0160254 A1 Jul. 20, 2006

(51) Int. Cl.
*H01L 21/66* (2006.01)
(52) U.S. Cl. .................................. 438/14; 257/E21.521
(58) Field of Classification Search ................ 438/184, 438/193, 195–198, 200–203, 206–207, 209–211, 438/218, 237, 165, 248, 268, 343, 294, 308, 438/6, 10, 104, 107–114, 121–123, 128–129, 438/135, 142, 145, 149, 151, 157, 176, 478
See application file for complete search history.

(56) References Cited

U.S. PATENT DOCUMENTS

| | | | | |
|---|---|---|---|---|
| 6,484,306 B1 * | 11/2002 | Bokor et al. | .................. | 716/21 |
| 7,037,735 B2 * | 5/2006 | Noguchi et al. | .............. | 438/18 |
| 7,098,055 B2 * | 8/2006 | Noguchi et al. | .............. | 438/18 |
| 2002/0168787 A1 * | 11/2002 | Noguchi et al. | .............. | 438/16 |
| 2003/0229410 A1 * | 12/2003 | Smith et al. | ................. | 700/109 |
| 2006/0030059 A1 * | 2/2006 | Noguchi et al. | .............. | 438/7 |
| 2006/0030060 A1 * | 2/2006 | Noguchi et al. | .............. | 438/14 |

* cited by examiner

*Primary Examiner*—Michael Lebentritt
*Assistant Examiner*—Andre Stevenson
(74) *Attorney, Agent, or Firm*—Harness, Dickey & Pierce, P.L.C.

(57) ABSTRACT

A method and system are provided for identifying systematic yield losses. The method comprising testing produced products using a test sequence, the testing sequence producing yield data, the yield data related to a wafer. For each zone of each wafer size calculating and storing a first data series R1, wherein each element of said first series is the yield of a said zone. Further calculating and storing for each element of R1 a second data series R2, wherein each element of the second series is a p consecutive element moving average of R1. Calculating and storing for each element of R1 a third data series R3 wherein each element of the third data series a p consecutive element moving standard deviation of data series R1. Calculating for each element of R1 a trigger point, wherein the trigger point is calculated as the respective R2 element less an adjusted respective R3 value. A notification is triggered when the trigger point calculated for each element of R1 is greater than the respective element of R1.

12 Claims, 11 Drawing Sheets

|        |                | Predicted |  |
|--------|----------------|---------------|-------------|
|        |                | No-degradation | Degradation |
| Actual | No-degradation | a | b |
|        | Degradation    | c | d |

Figure 11

SYSTEM AND METHOD FOR DETECTION OF SPATIAL SIGNATURE YIELD LOSS

TECHNICAL FIELD

This invention relates to a method and system for optimising system failure notification for products requiring quality to be within certain standards by enabling the identification of systematic yield losses through observing the spatial signature.

BACKGROUND ART

Rapid yield degradation detection in modern fabrication facilities is important. Identifying the cause cuts the losses suffered from process and equipment failure and helps improve profitability. Yield losses are usually classified as either random yield losses or systematic yield losses. Systematic yield losses usually result in a spatial signature that can be observed on an escort wafermap. Early detection of the spatial signature is important as the derogation can quickly spread from a small area to a large area. One method of detection is to manually review the spatial signature. The difficulty with this method is that it is time consuming and is based on the subjective judgement of an engineer. In particular the differing subjective judgement can result in early triggering, non-triggering, late triggering and in particular inconsistent triggering.

U.S. Pat. No. 5,982,920 to Tobin et al. describes a method to automatically detect defects in spatial signatures the system described relies on visual grouping and shape analysis and therefore is complicated to implement.

Other problems in detecting degradation include the non-linear process manufacturing nature of wafer fabrication adding to the complexity of identifying degradation and the different volumes produced of different products.

DISCLOSURE OF INVENTION

It is an object of the present invention to overcome the above disadvantages or at least provide the public or industry with useful choice.

Accordingly what is needed is a method of identifying systematic yield losses, said method comprising:

testing produced products using a test sequence, said testing producing yield data, said yield data related to a wafer;

dividing said wafer into multiple zones, each said zone containing a number individual chips, each individual chip being in multiple zones;

calculating and storing for each zone of said wafer a first data series R1, wherein each element of said first series is the yield of a said zone of said wafer for each tested wafer of the same size;

calculating and storing for each element of R1 a second data series R2, wherein each element of said second series is a p consecutive element moving average of R1;

calculating and storing for each element of R1 a third data series R3 wherein each element of said third data series a p consecutive element moving standard deviation of data series R1;

calculating for each element of R1 a trigger point, wherein said trigger point is calculated as the respective R2 element less an adjusted respective R3 value; and triggering a notification when the trigger point calculated for each element of R1 is greater than the respective element of R1, wherein the yield of a zone is the number of acceptable individual chips divided by the total number of chips in said zone.

Preferably said adjusted R3 value is the respective R3 value multiplied by a factor N wherein N differs for each wafer die size.

Preferably the value of N to be used is calculated using a confusion matrix and historic data, said data including data on the success and failure of detecting suspect production tools, said value to be used determined when the accuracy of detection and the capture rate are maximised.

Preferably the value of p is 30.

In a second aspect the present invention consists in a system implementing any of the above methods.

In a third aspect the present invention consists in software for affecting any of the above methods

BRIEF DESCRIPTION OF THE DRAWINGS

FIG. 3 is a diagram showing a wafer classified into sixteen zone groups;

FIG. 5 is a diagram showing a wafer classified into column zone groups;

FIG. 10 is a example graph of a sixteen zone group calculation; and.

FIG. 11 is a example of the confusion matrix of the present invention.

BEST MODES FOR CARRYING OUT THE INVENTION

The present invention consists of a method of identifying failure in a manufacturing system and in particular to identify processing tools that are causing problems in the manufacturing process.

Figure 1:
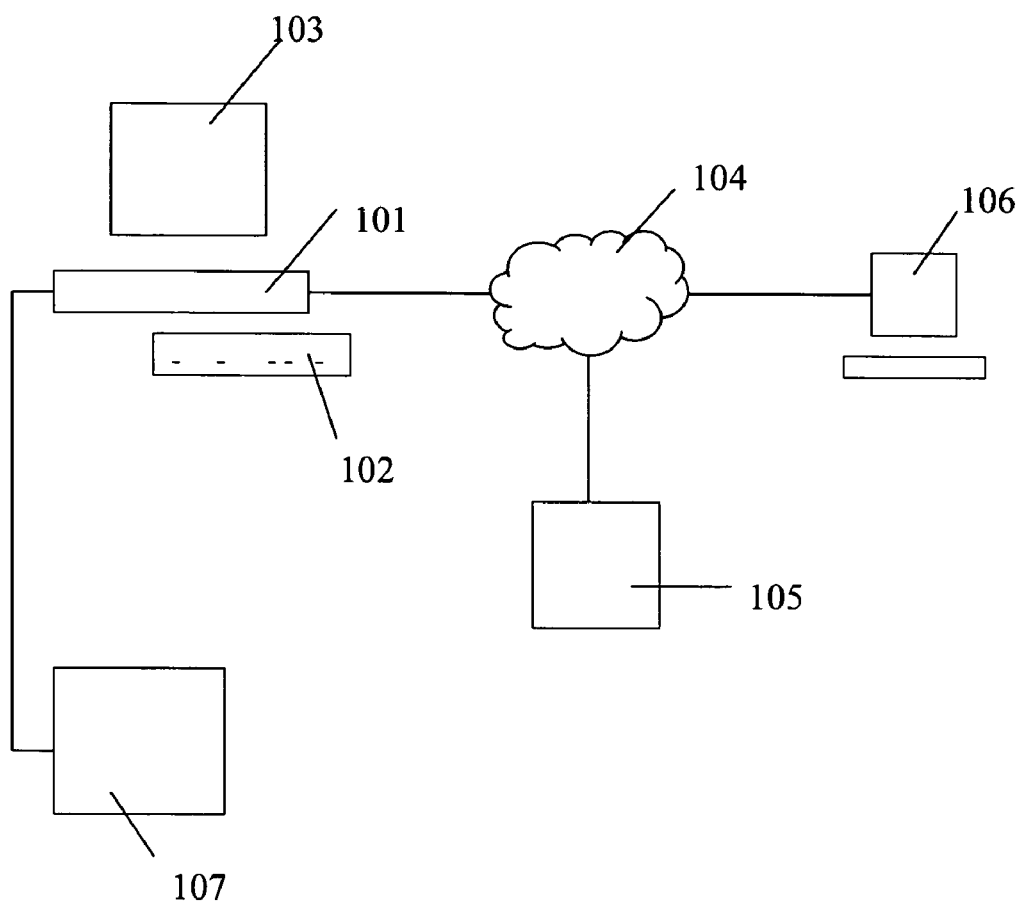
FIG. 1 is a block diagram of the system according to the invention illustrating the hardware components and the interconnection between the components.

Referring to FIG. 1 a data processing system for practicing the present invention is shown. A computing device 101 including at least one CPU, system memory, a data storage device, means to input data 102 such as a keyboard and a display device is shown. The computing device will preferable be connected to a network 104 through a network interface or adaptor. The network 104 preferably includes connections to testing systems 105 in a fabrication plant and other computer systems 106. The system can also include devices for informing users such as printers 107.

While in the preferred form of the invention the testing systems are directly connected to the computer system the data required by the present invention can be entered either manually or via other means such as being stored on portable storage media.

The system of the present invention receives the yield of all lots or batches processed through a fabrication plant.

Figure 2:
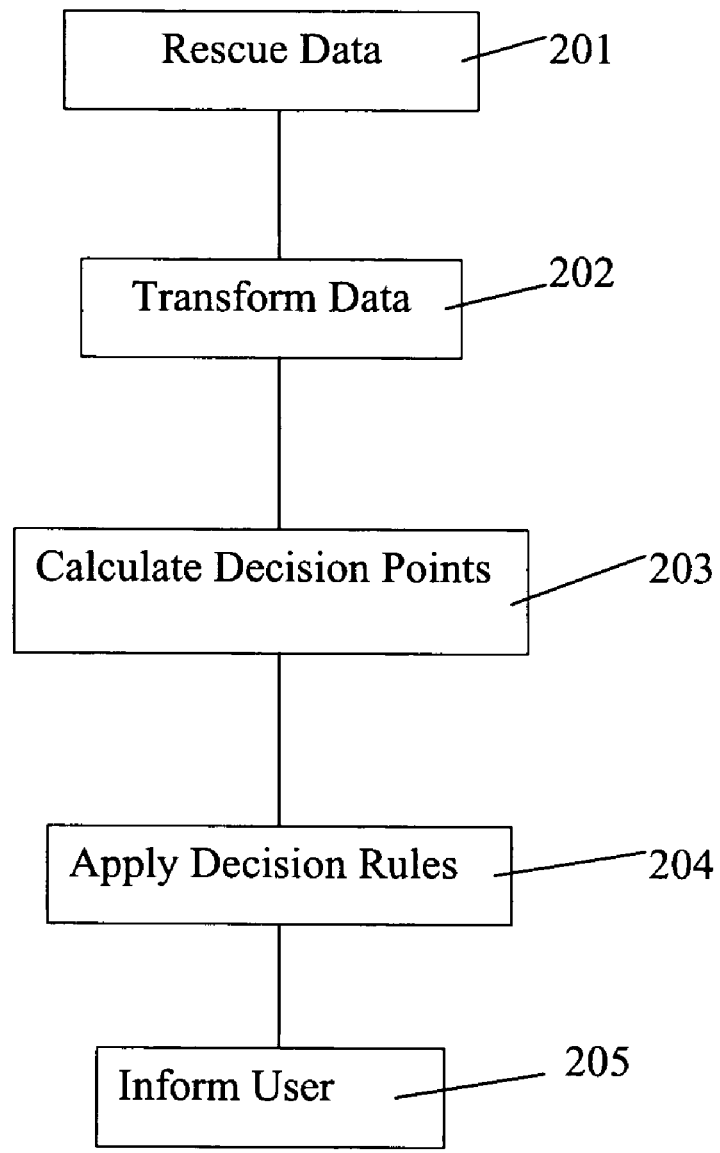
FIG. 2 is a flow diagram illustrating the process of the present invention.

Referring to FIG. 2 the method consists of obtaining the necessary data 201 and transforming the data 203. Based on the obtained data decision points 203 are calculated, the data is sorted based on the time each wafer is processed. Having sorted the data a set of decision rules are applied 204 to identify special signatures. In the preferred embodiment the system informs the user via email, however the system could print reports or notify the system user by other suitable means.

Figure 3:
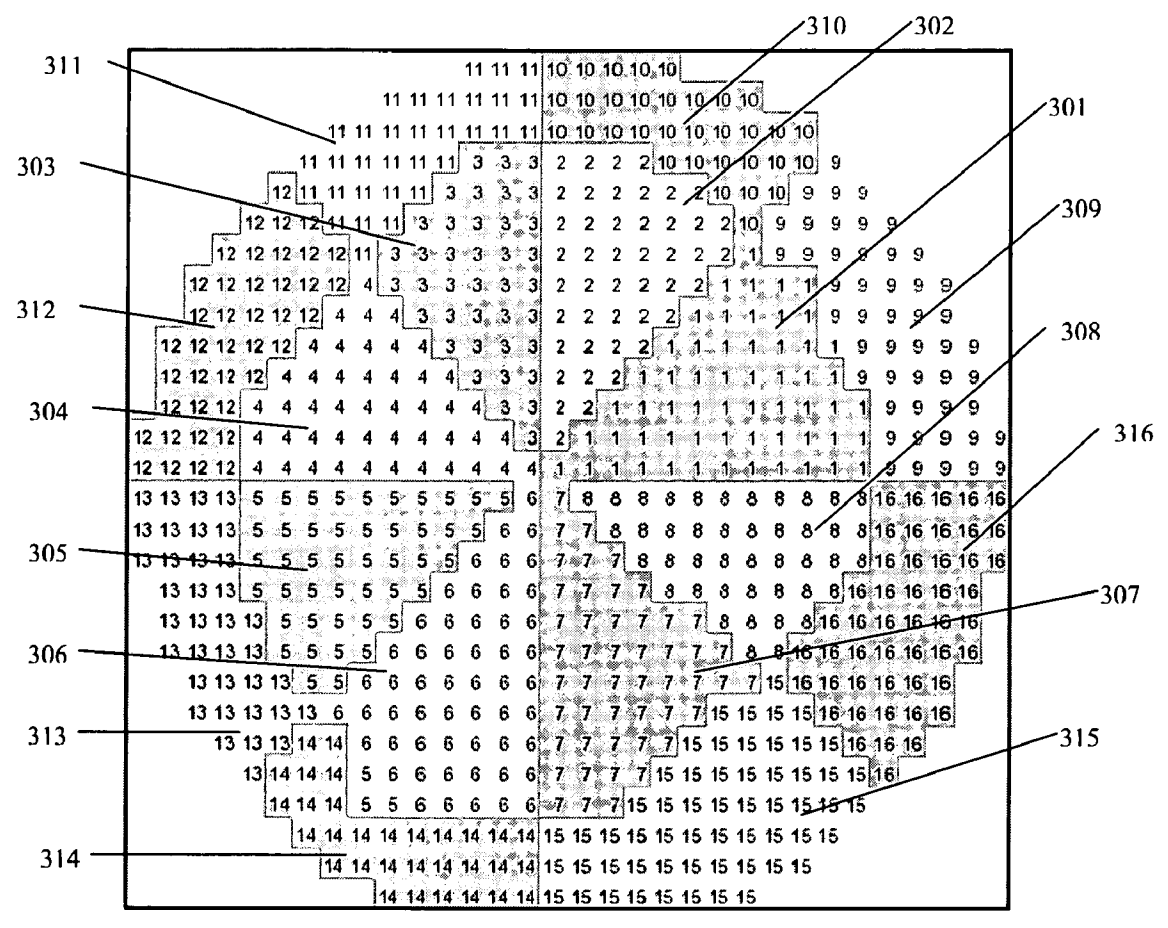
Figure 4:
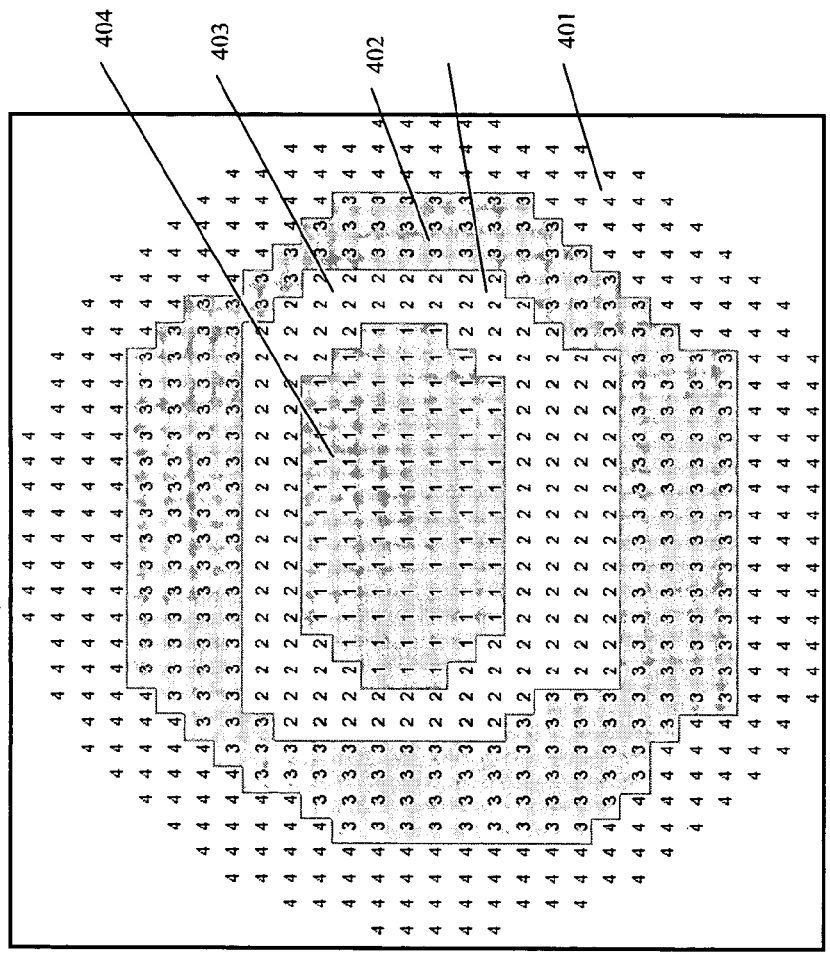
FIG. 4 is a diagram showing a wafer classified into four ring zone groups.
Figure 5:
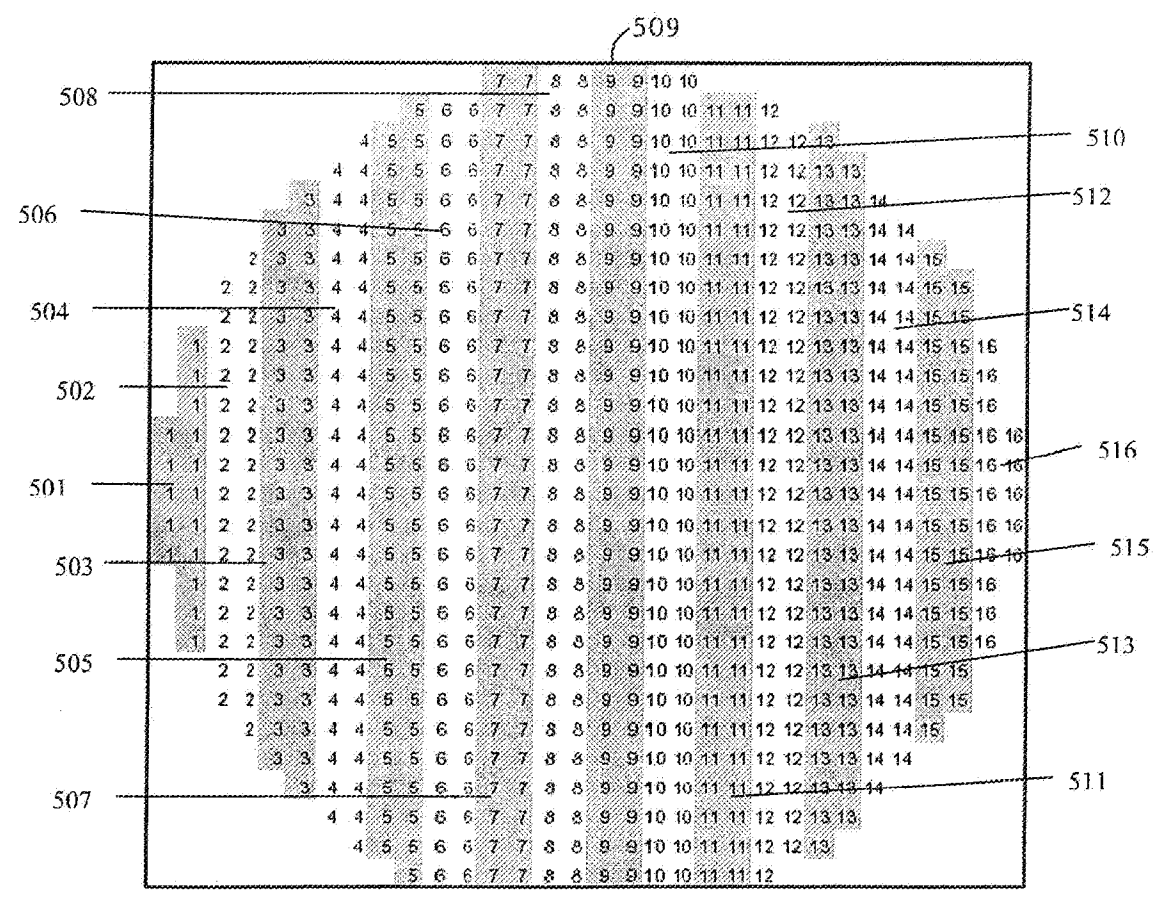
Figure 6:
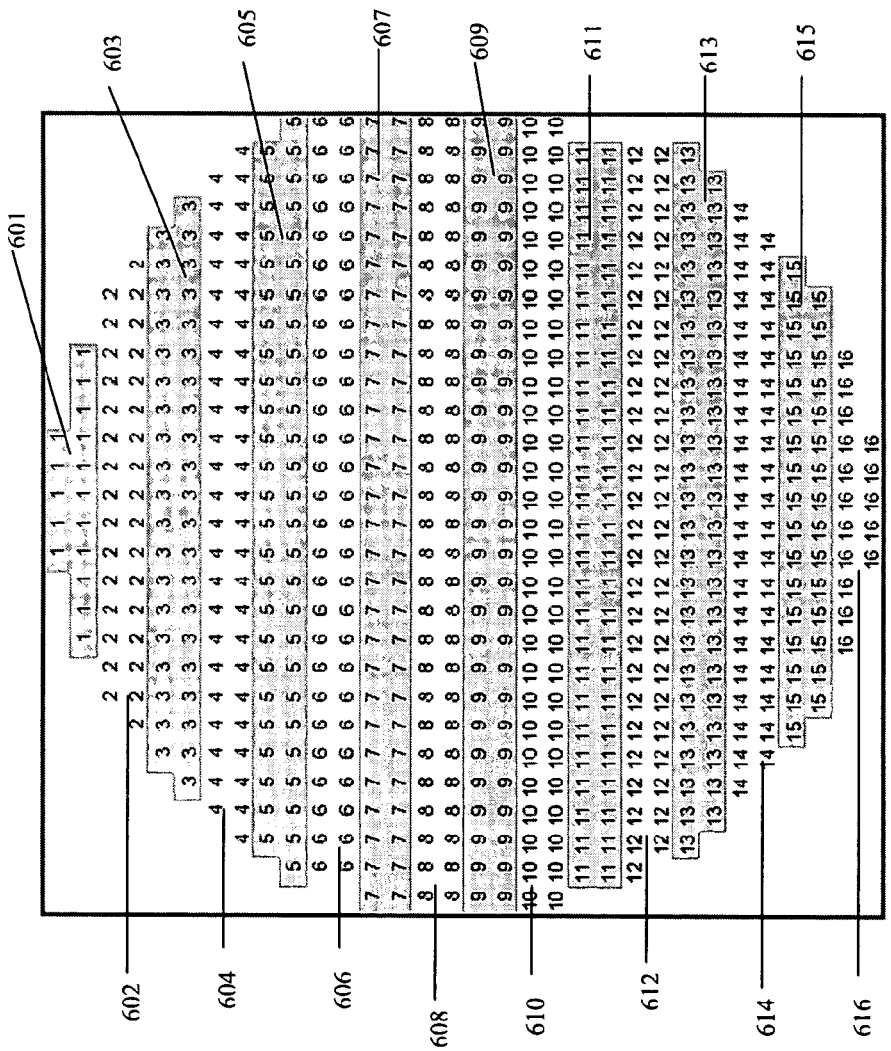
FIG. 6 is a diagram showing a wafer classified into row zone groups.

The data obtained preferably includes the processing time and the yield. The yield data identifies the individual chips on a wafer and whether of not the chip is deemed satisfactory or not. The system using this data calculates the yields of all the zones on a wafer. Based on research four ways of zoning a wafer to identify spatial signatures have been identified. Referring to FIG. 3 sixteen cluster zones 301–316 are identified and yield data for each zone $z_1$ to $z_{16}$ is calculated. Referring to FIG. 4 four ring zones 401 to 404 are identified and yield data for each zone $z_1$ to $z_4$ is calculated. Referring to FIG. 5 multiple column zones 501 are identified and yield data for each zone $z_1$ to $z_n$ is calculated. Referring to FIG. 6 multiple row zones 601 are identified and yield data for each zone $z_1$ to $z_n$ is calculated. The data thus calculated is stored as dataset R1.

The average and standard deviation of each zone in the dataset R1 are calculated based on a certain number of lots, using the last thirty lots has proven to provide satisfactory results. This is stored as dataset R2.

To identify whether a zone is a trigger point the system then applies trigger rules. The trigger rule will differ between wafer die sizes. The trigger rules for each die size can be calculated ahead of time. The system will then mark the zones that trigger rules and will identify the trigger to users. A zone will trigger a notification if the zonal yield of a particular zone is less than a trigger value. For each size of wafer the trigger value is the average zonal yield less the standard deviation of the zone adjusted by a factor N. In the preferred embodiment multiplying the standard deviation by N provides the adjustment.

Figure 11:
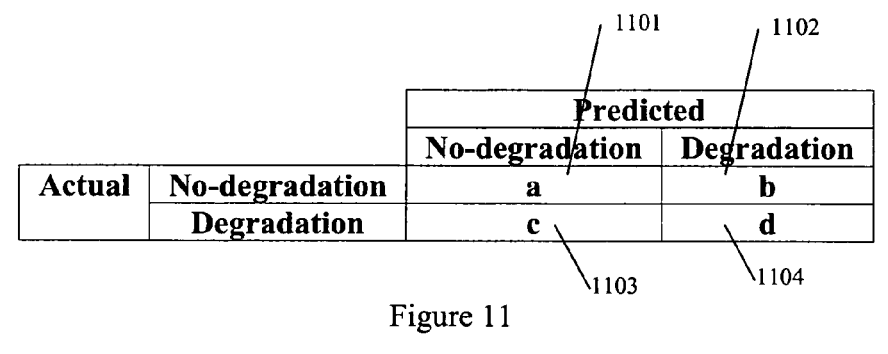

For each wafer size, N can be calculated using a confusion matrix. Referring to FIG. 11 a confusion matrix as it applies to the present invention is shown. The cell marked "a" 1101 represents the number of times that the method has predicted that there is no degradation correctly. The cell marked "b" 1102 represents the number of times that the method has predicted degradation incorrectly. The cell marked "c" 1103 represents the number of times that the method has not predicted degradation when there has been degradation. The cell marked "d" 1104 is the number of times the system has correctly predicted degradation.

In the case of this method, the accuracy of the number of times that the method does not trigger is not important. Therefore the accuracy of the method is defined as d/(d+b) and the capture rate being the number of times degradation is correctly identified is defined as d/(c+d).

In the preferred embodiment data on identified degradation is obtained and stored. This includes data on correctly and incorrectly predicted degradation and data on degradation not predicted by the method. The system recalculates the trigger points until the accuracy and the trigger rate of the proposed trigger points are above 90%.

Referring to FIGS. 7 to 10 the present invention will be illustrated with reference to an example. In all the figures the wafers identified as one to twelve are the same wafer and all the wafers are of the same size.

Figure 7:
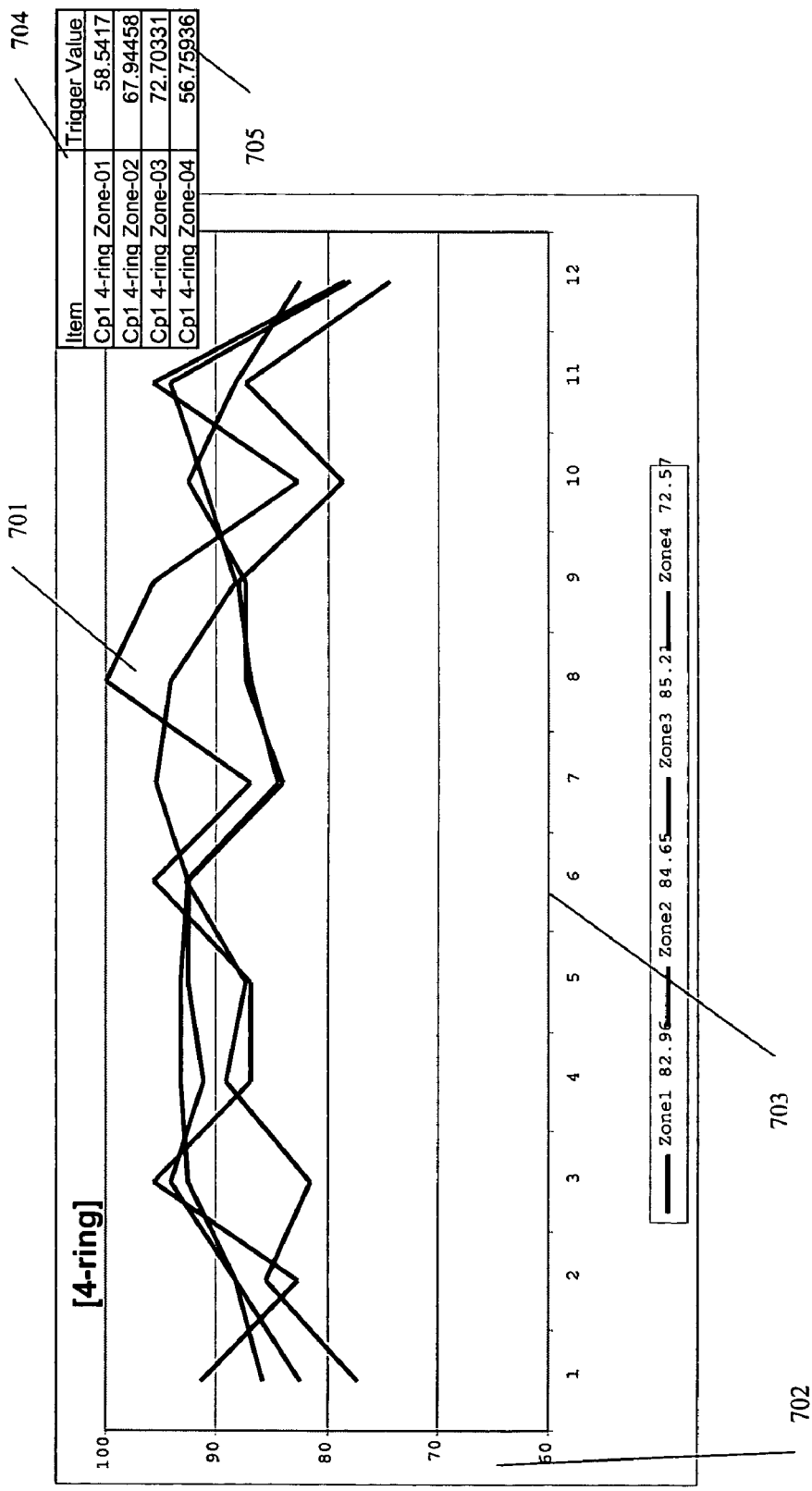
FIG. 7 is an example graph of a four ring zone calculation.

In FIG. 7 the 4-ring zone is graphed 701 with the wafer on the x-axis 703 and the calculated value on the y-axis 702. The list of zones is show in the first column 704 and the calculated trigger value is shown in the second column 705.

Figure 8:
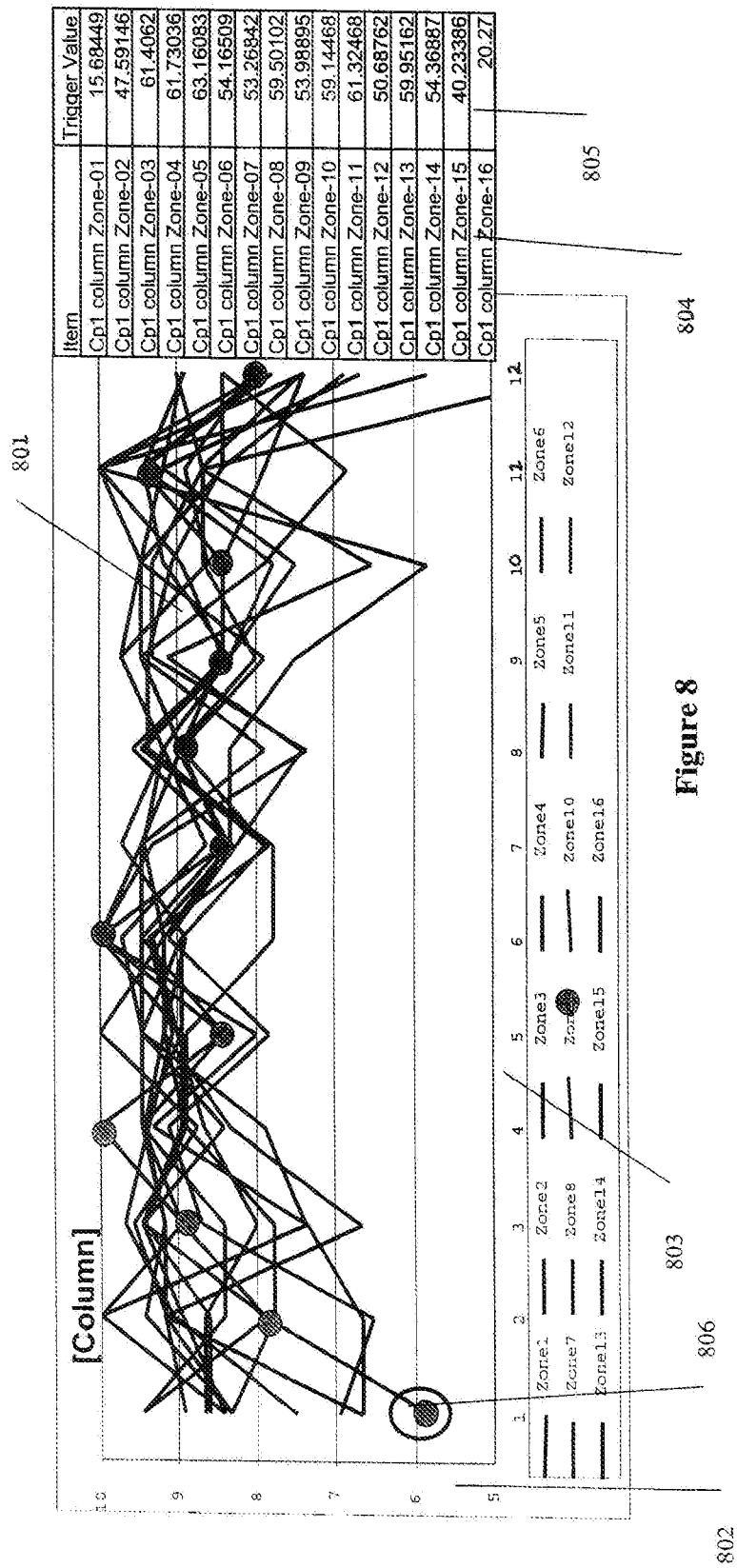
FIG. 8 is an example graph of a column zone calculation.

In FIG. 8 the column zoning is graphed 801 with the wafer on the x-axis 803 and the calculated value on the y-axis 802. The list of zones is show in the first column 804 and the calculated trigger value is shown in the second column 805. The first wafer is identified 806 as below the trigger value for one of the zones.

Figure 9:
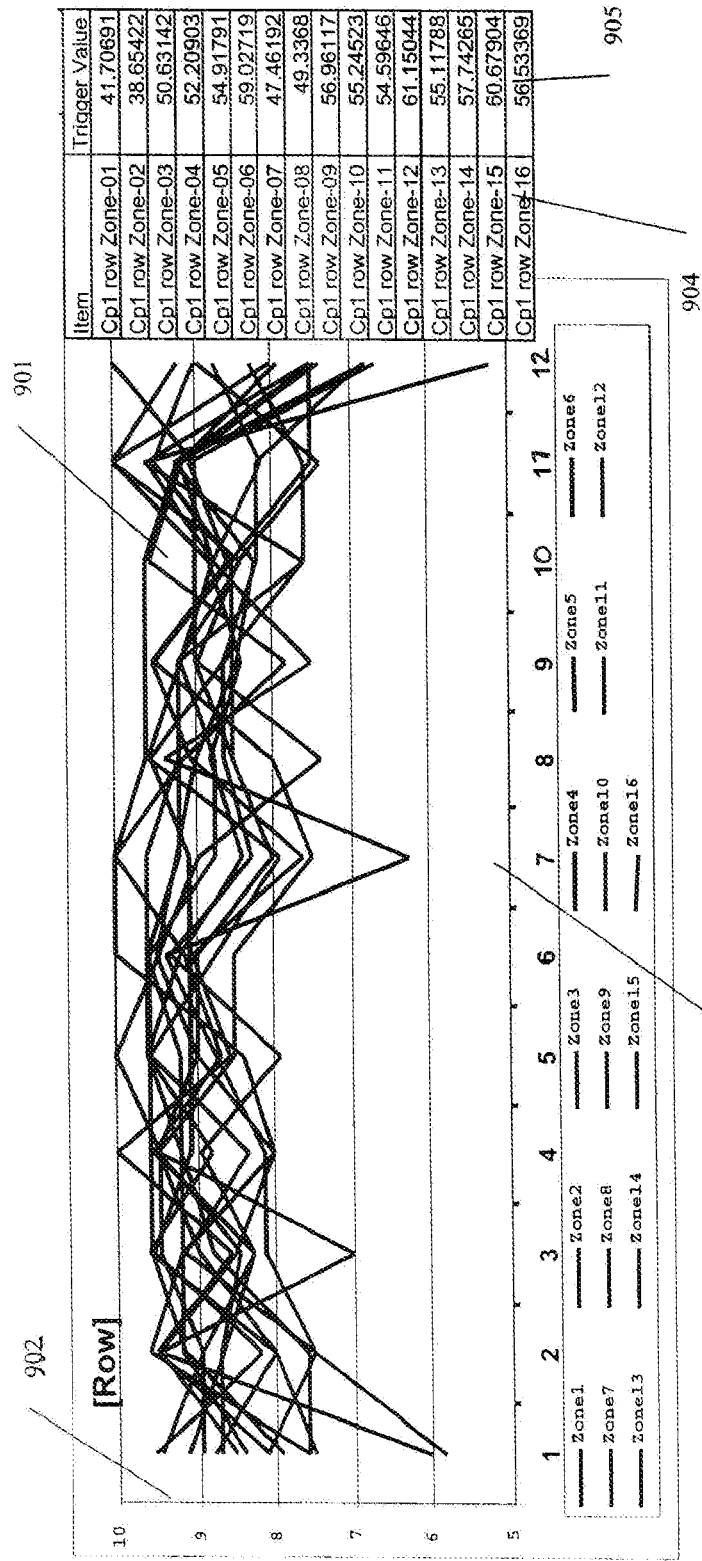
FIG. 9 is an example graph of a row zone calculation.

In FIG. 9 the row zoning is graphed 901 with the wafer on the x-axis 903 and the calculated value on the y-axis 902. The list of zones is show in the first column 904 and the calculated trigger value is shown in the second column 905.

Figure 10:
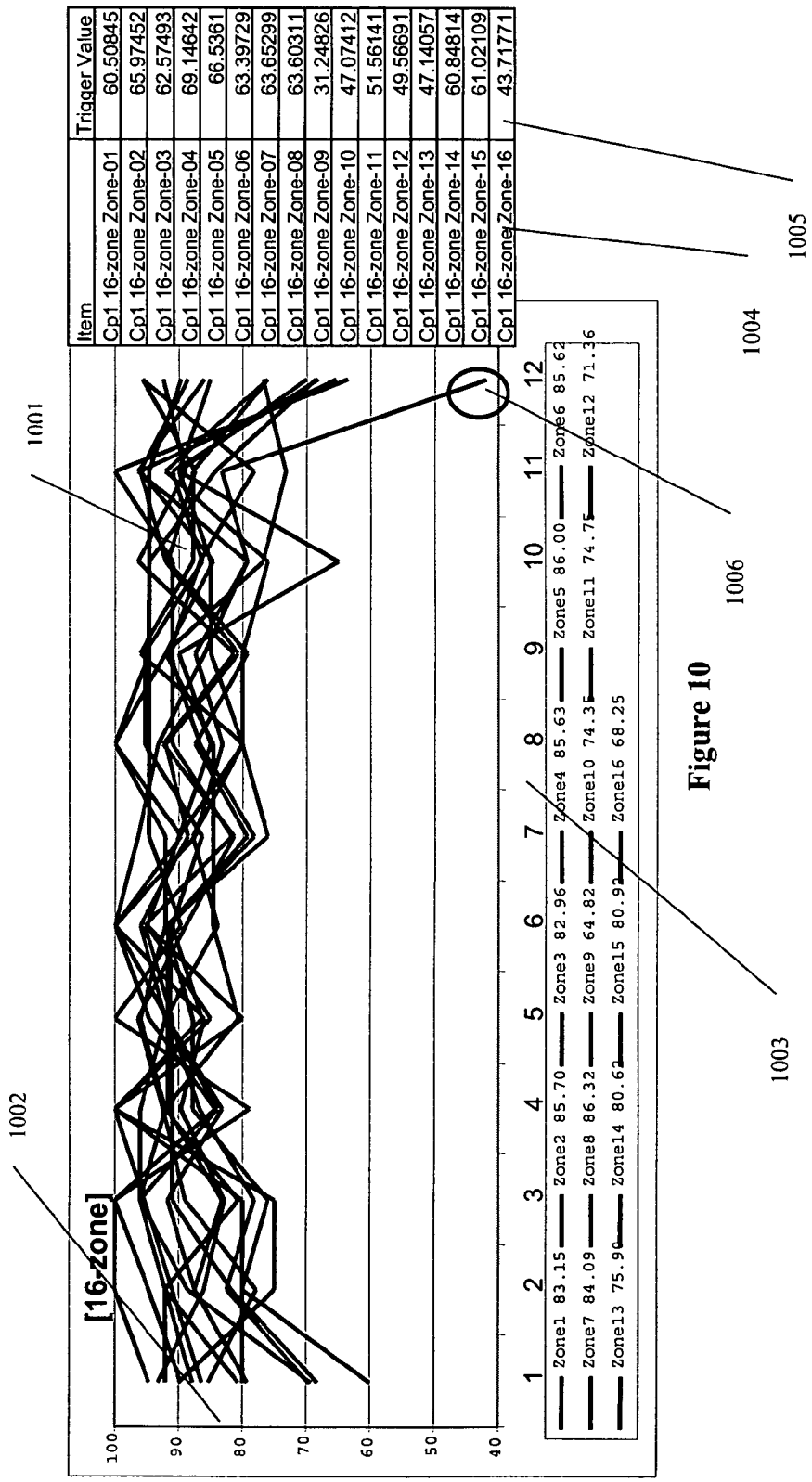

In FIG. 10 the 16 zones are graphed 1001 with the wafer on the x-axis 1003 and the calculated value on the y-axis 1002. The list of zones is show in the first column 1004 and the calculated trigger value is shown in the second column 1005. The twelfth wafer is identified 1006 as below the trigger value for one of the zones.

Any one triggering of any of the zones is enough to trigger an alarm, in this case an alarm would be trigger for the first and twelfth wafer.

To those skilled in the art to which the invention relates, many changes in construction and widely differing embodiments and applications of the invention will suggest themselves without departing from the scope of the invention as defined in the appended claims. The disclosures and the descriptions herein are purely illustrative and are not intended to be in any sense limiting.

The invention claimed is:

1. A method of identifying systematic yield losses, said method comprising:
   testing produced products using a test sequence, said testing producing yield data, said yield data related to a wafer;
   dividing said wafer into multiple zones, each said zone containing a number of individual chips, each individual chip being in multiple zones;
   calculating and storing for each zone of said wafer a first data series R1, wherein each element of said first series is the yield of a said zone of said wafer for each tested wafer of the same size;
   calculating and storing for each element of R1 a second data series R2, wherein each element of said second series is a p consecutive element moving average of R1;
   calculating and storing for each element of R1 a third data series R3, wherein each element of said third data series is a p consecutive element moving standard deviation of data series R1;
   calculating for each element of R1 a trigger point, wherein said trigger point is calculated as the respective R2 element less an adjusted respective R3 value; and
   triggering a notification when the trigger point calculated for each element of R1 is greater than the respective element of R1,
   wherein the yield of a zone is the number of acceptable individual chips divided by the total number of chips in said zone.

2. A method of identifying systematic yield losses as claimed in claim 1 wherein said adjusted R3 value is the respective R3 value multiplied by a factor N wherein N differs for each wafer die size.

3. A method of identifying systematic yield losses as claimed in claim 2 wherein the value of N to be used is calculated using a confusion matrix and historic data, said data including data on the success and failure of detecting suspect production tools, said value to be used determined when the accuracy of detection and the capture rate are maximised.

4. A method of identifying systematic yield losses as claimed in claim 1 wherein the value of p is 30.

5. A method of identifying systematic yield losses as claimed in claim 2 wherein the value of p is 30.

6. A method of identifying systematic yield losses as claimed in claim 3 wherein the value of p is 30.

7. A method of identifying systematic yield losses as claimed in claim 1 wherein said user is notified by email.

8. A method of identifying systematic yield losses as claimed in claim 2 wherein said user is notified by email.

9. A method of identifying systematic yield losses as claimed in claim 3 wherein said user is notified by email.

10. A method of identifying systematic yield losses as claimed in claim 4 wherein said user is notified by email.

11. A method of identifying systematic yield losses as claimed in claim 5 wherein said user is notified by email.

12. A method of identifying systematic yield losses as claimed in claim 6 wherein said user is notified by email.

\* \* \* \* \*